United States Patent [19]

Nicholas et al.

[11] 3,906,259

[45] Sept. 16, 1975

[54] PULSE AMPLITUDE DETECTOR

[75] Inventors: John F. Nicholas, Liverpool; Edward A. Salvagni, Camillus, both of N.Y.

[73] Assignee: The United States of America as represented by the Secretary of the Army, Washington, D.C.

[22] Filed: Feb. 5, 1974

[21] Appl. No.: 439,820

[52] U.S. Cl............. 307/235 R; 328/115; 328/147; 328/150

[51] Int. Cl.²...................... H03K 5/153; H03K 5/20

[58] Field of Search..... 307/235 R, 235 A; 328/146, 328/147, 150, 115–117; 330/30 D

[56] References Cited

UNITED STATES PATENTS

| | | | |
|---|---|---|---|
| 3,033,996 | 5/1962 | Atherton | 307/235 R |
| 3,047,812 | 7/1962 | Brown | 328/147 |
| 3,573,638 | 4/1971 | Cox, Jr. et al. | 307/235 R |
| 3,725,795 | 4/1973 | Mesenhimer | 307/235 R |

*Primary Examiner*—John Zazworsky
*Attorney, Agent, or Firm*—Lawrence A. Neureither; Jack W. Voigt; Robert C. Sims

[57] ABSTRACT

An operational amplifier is equipped with peak selection circuits whereby the difference between adjustable dc voltage and a selected upper portion of an input pulse is amplified.

3 Claims, 3 Drawing Figures

PULSE AMPLITUDE DETECTOR

SUMMARY OF THE INVENTION

A pair of diodes have their outputs interconnected by a resistor. The outputs are further fed through other resistors to separate inputs of an operational amplifier. The value of the resistors are such that the operational amplifier will act as a differential amplifier. One diode has an adjustable dc reference voltage supplied thereto, while the other diode has the input signal which is to be peak detected and peak amplified. As long as the signal input is of a value less than a fixed percent of the adjustable reference voltage, its associated diode will be back biased, and the output of the amplifier will be at a constant value. However, when the input signal exceeds this value, the difference between an increase in this value and the dc reference voltage is amplified by the amplifier.

DESCRIPTION OF THE PREFERRED EMBODIMENT

Figure 1:
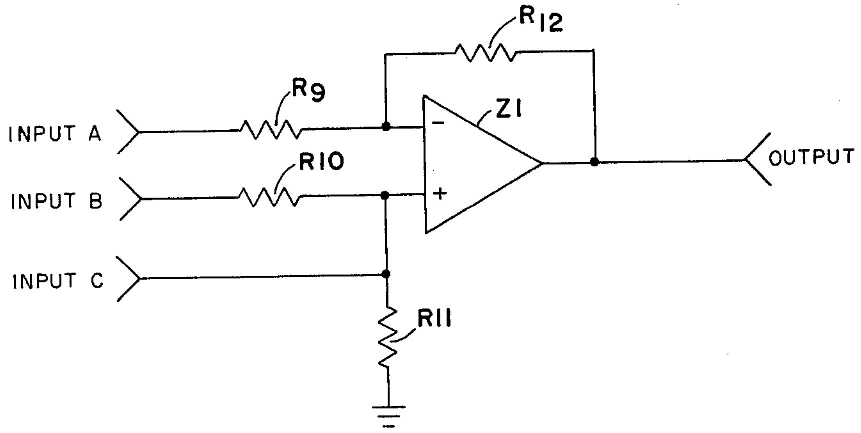
FIG. 1 is a schematic showing of a broad feature of the present invention.

Simplified schematic FIG. 1 shows a difference amplifier consisting of high gain operational amplifier Z1 and resistors R9, R10, R11 and R12. Regarding FIG. 1 the following assumptions are made:

1. Z1 input impedance is very much greater than resistances of R9, R10, R11 and R12.
2. Z1 voltage gain is very much greater than the ratio R12/R9 for all signal frequencies to be considered.
3. R10 = R9.
4. R11 = R12.

Regarding FIG. 1 the following parameters are defined:

1. With signal input to A only, voltage gain = volts out/volts in = $G_A$.
2. With A grounded and signal input to C only, voltage gain = $G_C$.
3. With A grounded, C open and signal input to B only, voltage gain = $G_B$.

From operational amplifier theory, the following facts are well known:

$$1.\ G_A = -\frac{R12}{R9}.$$

$$2.\ G_C = 1 + \frac{R12}{R9}.$$

When input B is used, resistors R10 and R11 form a divider so that $$G_B = G_C \times \frac{R11}{R10 + R11} = \left[1 + \frac{R12}{R9}\right] \times \frac{R11}{R10 + R11}.$$

Using assumptions No. 3 and No. 4 and substituting R9 and R12 in place of R10 and R11 in the above equation gives the following expression:

$$G_B = \left[1 + \frac{R12}{R9}\right] \times \frac{R12}{R9 + R12} = \frac{(R9 + R12)}{R9} \times \frac{R12}{(R9 + R12)} = \frac{R12}{R9}.$$

The above results can be summarized as follows:

$$1.\ G_A = -\frac{R12}{R9} \qquad (1)$$

$$2.\ G_B = +\frac{R12}{R9} \qquad (2)$$

3. $G_A + G_B = 0$, and FIG. 1 is a true difference amplifier in which equal and coincident inputs into A and B produce zero output.

Figure 2:
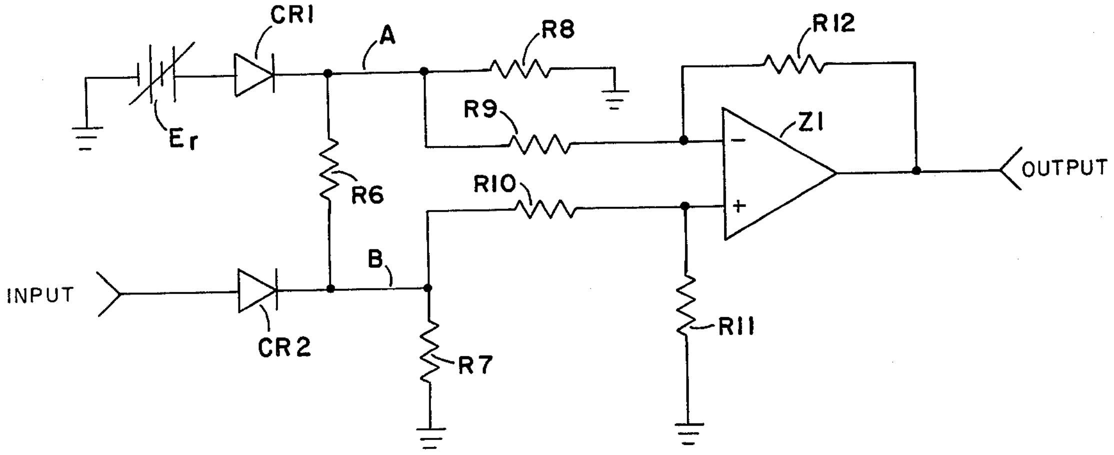
FIG. 2 is a schematic showing of the present invention.

Simplified schematic FIG. 2 shows the FIG. 1 circuit expanded by addition of resistor R6, equal valued resistors R7 and R8, signal diode CR2 and the adjustable reference voltage $E_r$ applied through diode CR1. Forward resistance and voltage drop of CR1 and CR2 are neglected.

When input signal is absent, CR2 is reverse biased, and a portion of $E_r$ exists across R6, biasing point A positive with respect to B and producing a negative dc offset voltage $E_o$ at the amplifier output. The relation between output dc offset voltage $E_o$ and $E_r$ (with algebraic proof omitted here) is:

$$E_o = E_r \times G_A \times \left[\frac{\left[\frac{R12}{R9} + 1\right] + \frac{R7}{R9}}{\left[\frac{R12}{R9} + 1\right]\left[1 + \frac{R7}{R6}\right] + \frac{R7}{R9}}\right] \qquad (3)$$

If R9 >> R7, $$E_o \cong E_r \times G_A \times \frac{1}{1 + \frac{R7}{R6}} \qquad (4)$$

If R9 >> R7 and R7 >> R6 by a factor of 10 to 1 or greater, $$E_o \cong E_r \times G_A \times \frac{R6}{R7} \qquad (5)$$

Therefore for a given reference voltage $E_r$ applied to point A, the zero signal dc output offset voltage is determined by the gain $G_A$ modified by a factor which depends on values of R6 and R7. These values are chosen to meet the following two objectives:

1. Avoidance of current and voltage saturation of active circuit elements to preserve fast response to signal transients.
2. Magnitude of offset voltage $E_o$ must be within limits acceptable to the function of the circuits to which it is applied.

Figure 3:
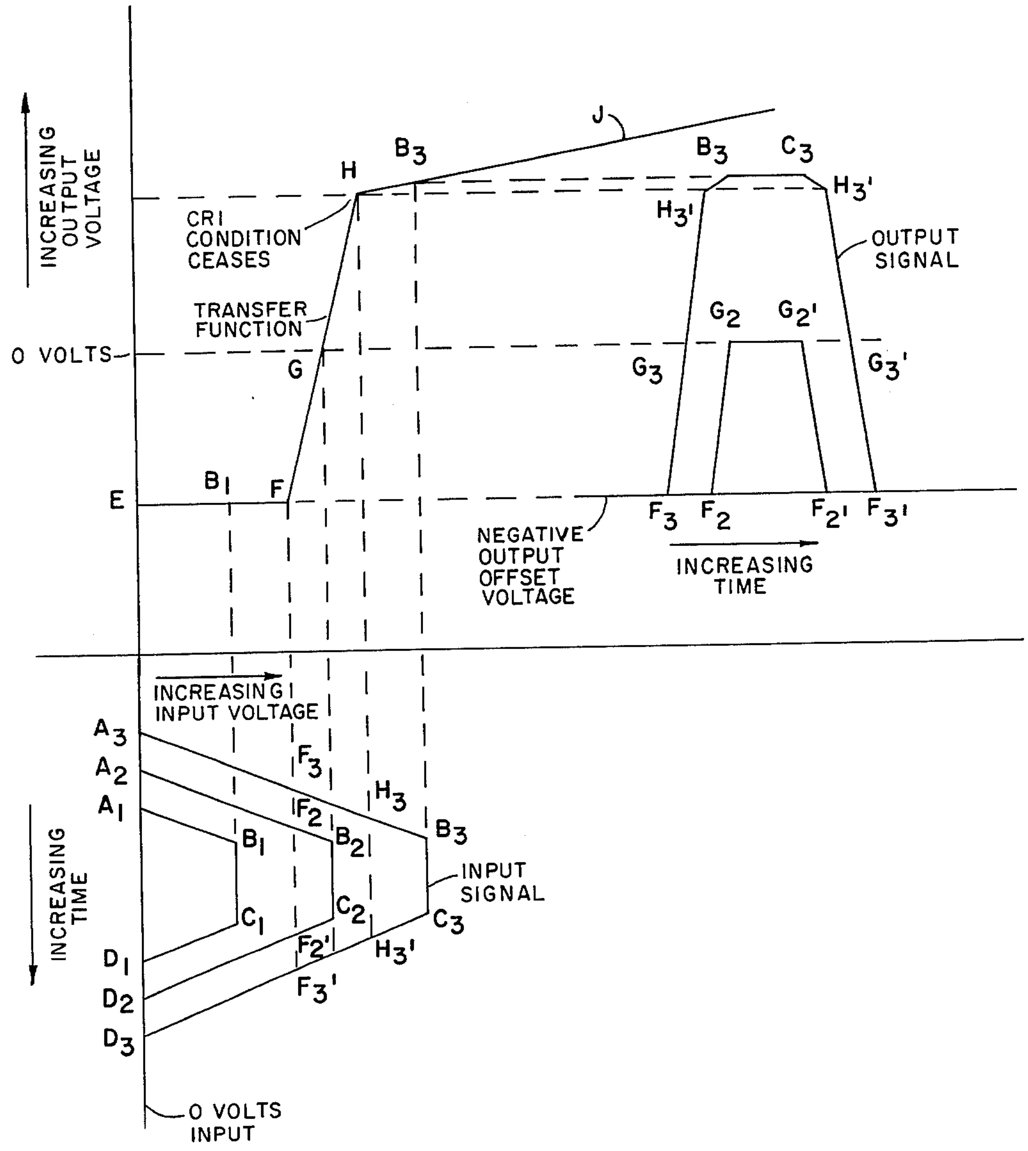
FIG. 3 is a graphic illustration of the transfer function of FIG. 2.

FIG. 3 is a graphical illustration of the transfer function of FIG. 2 circuit with its performance for three different input signal amplitudes.

Transfer function EFGHJ is a plot of output voltage as a function of input voltage. Input signal at the bottom of FIG. 3 has its voltage amplitude axis coincident with the input voltage axis of the transfer function.

Input signal vertical axis is the time scale. Output signal plotted to the right of transfer function has its amplitude axis coincident with output voltage axis of the transfer function. Output signal horizontal axis is time scale. Input signal is trapezoid shaped to facilitate identification of corresponding points on input and output signals.

EF on the transfer function is determined from equation (3) or (4) or (5). Amplitude of input signal $A_1B_1C_1D_1$ is not sufficient to cause conduction in CR2, and no output signal appears.

Portion $A_2F_2F_2'D_2$ of input pulse $A_2B_2C_2D_2$ is below transfer function point F and produces no output. Portion $F_2B_2C_2F_2'$ of input signal is amplified to produce output $F_2G_2G_2'F_2'$. Peak $G_2G_2'$ of this output signal is at zero voltage and would be design center level for delivery to a following circuit such as, for example, a sample and hold circuit.

Input signal $A_3B_3C_3D_3$ produces an output when its level is between $F_3F_3'$ and $H_3H_3'$. Below this range it is rejected, and above this range it produces only the severly limited additional output $H_3B_3C_3H_3'$. The segment FH of the transfer function therefore determines the "window" through which the upper portion of the input signal is accepted.

If in FIG. 2 the inputs to diodes CR1 and CR2 are interchanged, the reference voltage produces a positive output offset, and the amplified signal is inverted.

The offset zero signal output (with algebraic proof omitted is:

$$E_O = E_r \times G_B \times \left[ \frac{R6\left[\frac{R12}{R9} + 1 + \frac{R7}{R9}\right]}{R7\left[\frac{R12}{R9} + 1\right] + R6\left[1 + \frac{R7}{R9}\right]\left[\frac{R12}{R9} + 1\right]} \right] \qquad (6)$$

If R9 >> R7, $$E_o \cong E_r \times G_B \times \frac{1}{\frac{R7}{R6} + 1} \qquad (7)$$

If R7 >> R6, and R9 >> R7, $$E_o \cong E_r \times G_B \times \frac{R6}{R7} \qquad (8)$$

Therefore when the inputs of FIG. 2 are interchanged, the output offset voltage changes polarity but retains approximately the same magnitude.

We claim:

1. The system comprising an operational amplifier having first and second inputs and an output; a reference voltage means; first means connecting the reference voltage means to said first input of said amplifier; an input signal; second means connecting said input signal to the second input of said amplifier; first and second diodes being connected respectively between said reference voltage means and said first means, and said input signal and said second means; a first resistor having a first side connected between the first diode and said first means and a second side connected between the second diode and said second means so that said input signal will have no effect on the operation of the amplifier until it exceeds a predetermined value; a second resistor connected between the output of said amplifier and said first input of said amplifier; said second means being a third resistor; said first means being a fourth resistor; and said third and fourth resistors being equal in resistance to each other.

2. A system as set forth in claim 1 wherein said voltage reference means is adjustable and has a connection to ground; a fifth resistor connected between the second input of the amplifier and ground; a sixth resistor connected between first and third resistors and ground; said second and fifth resistors being equal to each other in resistance; and said fourth resistor being much greater than said sixth resistor which in turn is much greater in resistance to said first resistor.

3. A system as set forth in claim 2 further comprising a seventh resistor connected between said first and fourth resistors and ground; said reference voltage means being a dc adjustable reference voltage; said diodes being connected such that said reference voltage will apply a back biased voltage on said second diode when said input signal is below a predetermined value; and said amplifier linearly amplifying the portion of said input signal which exceeds said predetermined value.

* * * * *